US009208846B2

(12) United States Patent  (10) Patent No.: US 9,208,846 B2
Lassalle-Balier et al.  (45) Date of Patent: Dec. 8, 2015

(54) FREQUENCY RESISTANCE ACCESS MAGNETIC MEMORY

(71) Applicant: THE PROVOST, FELLOWS, FOUNDATION SCHOLARS, & THE OTHER MEMBERS OF BOARD, OF THE COLLEGE OF THE HOLY AND UNDIVIDED TRINITY OF QUEEN ELIZABETH NEAR DUBLIN, Dublin (IE)

(72) Inventors: Remy Lassalle-Balier, Dublin (IE); Michael Coey, Dublin (IE)

(73) Assignee: The Provost, Fellows, Foundation Scholars, & The Other Members of Board—Trinity College Dublin, Dublin (IE)

( * ) Notice: Subject to any disclaimer, the term of this patent is extended or adjusted under 35 U.S.C. 154(b) by 0 days.

(21) Appl. No.: 14/074,075

(22) Filed: Nov. 7, 2013

(65) Prior Publication Data

US 2014/0160834 A1  Jun. 12, 2014

Related U.S. Application Data

(60) Provisional application No. 61/723,728, filed on Nov. 7, 2012.

(51) Int. Cl.
*G11C 11/16* (2006.01)
*G11C 11/56* (2006.01)
(52) U.S. Cl.
CPC .......... *G11C 11/161* (2013.01); *G11C 11/1673* (2013.01); *G11C 11/1675* (2013.01); *G11C 11/5607* (2013.01)

(58) Field of Classification Search
CPC .............................. G11C 11/16; G11C 11/161
USPC .......................................... 365/158, 148, 171
See application file for complete search history.

(56) References Cited

U.S. PATENT DOCUMENTS

| 2007/0247901 | A1  | 10/2007 | Akinaga et al. |
| 2009/0116310 | A1* | 5/2009  | Florez Marino et al. 365/189.16 |
| 2009/0147562 | A1* | 6/2009  | Clinton et al. ................. 365/158 |
| 2010/0128510 | A1* | 5/2010  | Cowburn ......................... 365/80 |

FOREIGN PATENT DOCUMENTS

WO  2010/055329  5/2010

OTHER PUBLICATIONS

Parkin et al., "Magnetic Domain-Wall Racetrack Memory", *Science*, vol. 320, No. 5873, pp. 190-194, 2008.
Yamada et al., "Electrical Switching of the Vortex Core in a Magnetic Disk," Nature Materials, vol. 6, Apr. 2007, pp. 269-273.

* cited by examiner

*Primary Examiner* — Huan Hoang
*Assistant Examiner* — Jay Radke
(74) *Attorney, Agent, or Firm* — Occhiuti & Rohlicek LLP

(57) ABSTRACT

The invention provides a multibit magnetic memory structure comprising a stack of two or more magnetic plaquettes, each of which has at least three distinct magnetic states. The invention provides for a new type of vertical memory where each layer encodes information in two degrees of freedom, which has the potential to increase the theoretical storage capacity by factor $4^n$. The information is read, through the resonant frequency of the stack or through a combination of the resonant frequency and resistance.

14 Claims, 3 Drawing Sheets

Drawings

FREQUENCY RESISTANCE ACCESS MAGNETIC MEMORY

CROSS REFERENCE TO RELATED APPLICATION

This application claims the benefit of the priority date of U.S. Provisional application 61/723,728, filed on Nov. 7, 2012.

FIELD

The invention relates to a magnetic structure, and in particular a multi-bit magnetic memory cell structure.

BACKGROUND

The architecture of electronic circuits, and magnetic memory—both magnetic random-access memory and hard-disc memory—is essentially two-dimensional. A single bit is recorded in the free layer of a spin valve or in a thin patch of ferromagnetic material. With the relentless pressure to increase record density, the lateral dimensions of a bit are being pushed well below 100 nm, where the physical limits inherent in known magnetic materials will inevitably begin to make themselves felt. The simplest of these is the criterion for long-term thermal stability:

$$KV/kT > 60$$

where K is an anisotropy constant of the ferromagnetic material, V is the volume of the magnetic bit, k is Boltzmann's constant and T is temperature. In the case of hard-disk recording, it has been possible to push back this superparamagnetic limit by ingenious magnetic engineering, but a radically different approach will be needed if magnetic memory is to be of use in the 2020s.

A way out is to somehow exploit the third dimension, storing the information vertically. Magnetic racetrack memory, *Magnetic Domain-Wall Racetrack Memory* as disclosed in S. S. Parkin, M. Hayashi and L. Thomas, "Magnetic Domain-Wall Racetrack Memory," *Science*, vol. 320, no. 5873, pp. 190-194, 2008 uses this approach. A vertical shift register uses spin-transfer torque to drive magnetized magnetic domains (separated by domain walls).

Another idea is the magnetochiral permalloy stack as disclosed in PCT patent publication number WO/2010/055329, Cowburn, Russell P., entitled 'Magnetic data storage using chiral soliton'. These solutions increase the storage per unit area by a factor of order $2^n$ where 2 is the number of states in each bit, and n is the number of bits that can be stored vertically.

U.S. patent publication number US2009/0147562, assigned to Seagate Technology, discloses a compound magnetic data storage cell, applicable to spin-torque random access memory (ST-RAM), is disclosed. A magnetic data storage cell includes a magnetic storage element and two terminals communicatively connected to the magnetic storage element.

U.S. patent publication number US2007/0247901, Akinaga et al, discloses a mesoscopic magnetic body comprising a tabular ferromagnetic body whose planar shape has an axis of symmetry, but which is not symmetric in the direction perpendicular to the axis of symmetry, and wherein the magnetic body shows a circular single domain structure upon removal of the external parallel magnetic field.

It is an object to provide a new and improved magnetic structure for use in magnetic memory applications.

SUMMARY

According to the invention there is provided a multibit magnetic memory structure comprising a stack of two or more magnetic plaquettes (known herein as CHIMPs), each of which has at least three distinct magnetic states.

The invention provides for a new type of vertical memory where each layer encodes information in two degrees of freedom, which has the potential to increase the theoretical storage capacity by factor $4^n$. The information is read, not through a single value (resistance or stray field), but it is multiplexed in both frequency and/or resistance. The development of frequency resistance-accessed magnetic memory (FRAMM) facilitates dramatic improvements in non-volatile storage memory. The invention relies on established magnetic tunnel junction technology, which is currently being implemented in conjunction with CMOS.

The term 'plaquette' in the context of the present invention should be interpreted broadly to encompass any element that can comprise three or more distinct magnetic states.

In one embodiment the plaquettes interact by dipole or exchange interactions so that different magnetic states of the stack are distinguished by distinct resonant frequencies.

In one embodiment the distinct resonant frequencies are higher than 100 kHz.

In one embodiment different magnetic configurations of the stack are distinguished by distinct values of the resistance or resonant frequency of the stack.

In one embodiment magnetic chirality of individual plaquettes is adapted to be written by electric current pulses using spin transfer torque.

In one embodiment a magnetic vortex core polarity of individual plaquettes is adapted to be written by electric current pulses using spin transfer torque.

In one embodiment four different states can be controlled by said electrical pulses.

In one embodiment the contents of the memory are read from the resistance and/or frequency response of the stack.

In one embodiment the contents of the memory are written by a current pulse (square pulse or a pulse with the characteristic resonant frequency or a series of any of these).

In one embodiment there is provided a multibit magnetic memory structure comprising a stack of two or more magnetic elements, each of which has at least three distinct magnetic states.

In one embodiment, the magnetic configuration of the CHIMP can be read from the frequency response of the stack.

BRIEF DESCRIPTION OF THE DRAWINGS

The invention will be more clearly understood from the following description of an embodiment thereof, given by way of example only, with reference to the accompanying drawings, in which.

Figure 3:
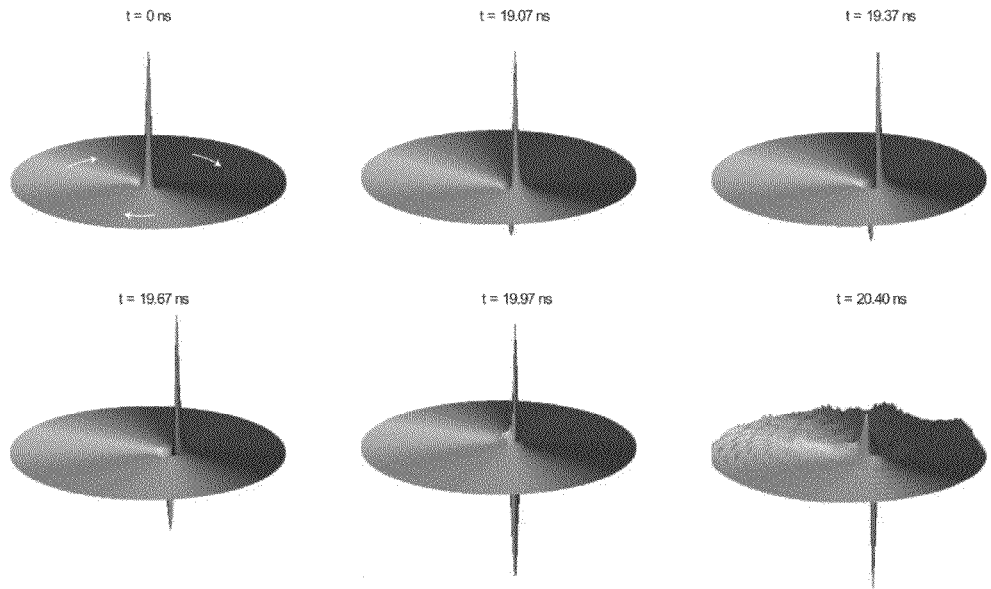
Figure 4:
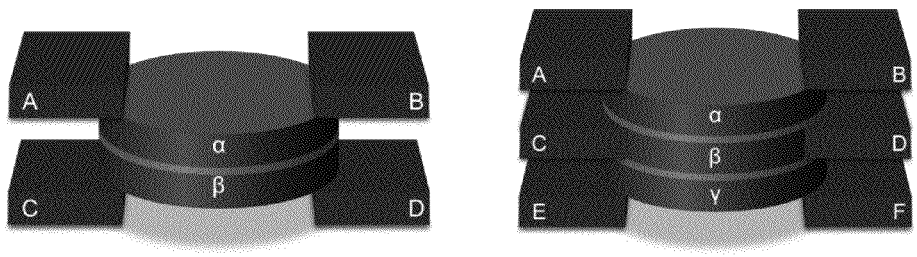
Figure 5:
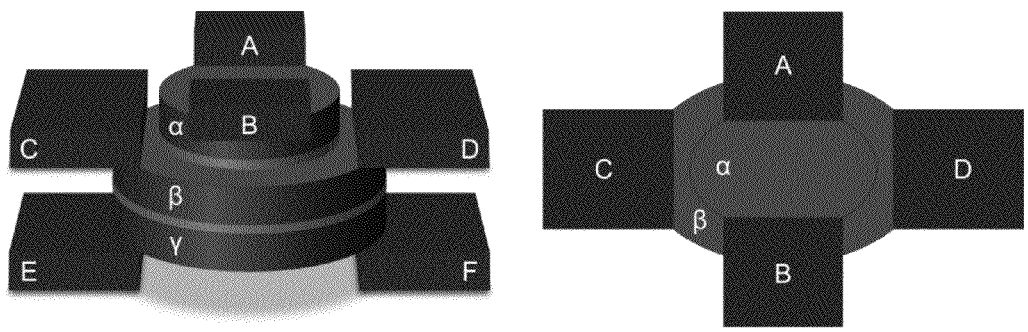

Figures B and G show the result of the current pulse applied along the green arrows. Figures C and G show the end of the first stage of the magnetisation stabilisation (due to demagnetising field). Figure D and H represent the final state with reversed chirality;

FIG. 3: Simulation of polarity reversal with AC current;

FIG. 4: (Left) This is the simplest FRAMM (made of a two-CHIMP stack). CHIMPs, called α and β, are separated by an insulator. Contacts A, B, C and D are used to control the FRAMM. (Right) This is the three-CHIMP stack. Note that this is a simplified version, lateral contacts C and D would be extremely difficult to realise this way;

FIG. 5: Illustration of the "Pagoda" version of the FRAMM. This modification solves the contact issue of the middle CHIMP. (Left) 3D view. (Right) top view; and FIG. 6: Simulated spectra of a two CHIMP stack with 2 nm thickness, spaced by 2 nm, made of permalloy (magnetisation of 800 kA/m, damping of 0.01 and no anisotropy) in four cases, antiparallel polarities and parallel chirality (A), antiparallel polarities and antiparallel chirality (B), parallel polarities and parallel chirality (C), parallel polarities and antiparallel chirality (D). CHIMPs.

DETAILED DESCRIPTION OF THE DRAWINGS

The concept of FRAMM is based on the magnetic configuration of a stack of chiral magnetic plaquettes known as CHIMPs. The plaquettes are stacked along the z-axis (out of plane direction) and are separated by insulating or metallic layers. The giant magnetoresistance (GMR) or tunnel magnetoresistance (TMR) of the stack can be measured, and further information is read from its radiofrequency response. The magnetic vortices are written by spin transfer torque and shape anisotropy. The full stack is read as a whole with measurement through the stack, while the writing process may be done on each vortex element individually, or on the stack as a whole.

Magnetic Vortex

The memory elements of FRAMM are the stack of chiral magnetic plaquettes (CHIMPs). The required magnetic structure is obtained for a specific range of thickness, surface and eccentricity of the shaped ferromagnetic element). As shown in FIG. 1A, the main part of a vortex structure of a CHIMP consists of a large chiral swirl. FIG. 1B and FIG. 1C show the vortex core that can be found at the centre of the swirl, where the magnetization is perpendicular to the plane of the plaquette. Each of these parts of the vortex exhibits a degree of freedom, the chirality for the swirl may be clockwise [+] or counter clockwise [−], and the polarity of the core may be up [↑] or down [↓]. Therefore, each vortex has four distinct magnetic states: (↑; −); (↑; +) (↓; −) and (↓; +). In comparison a ferromagnetic layer in a conventional spin valve has just two magnetic states.

Figure 1:
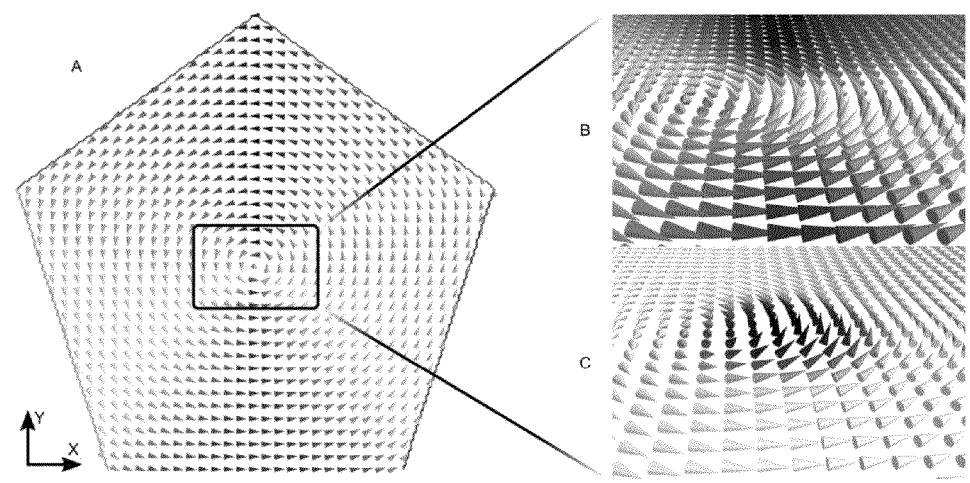
FIG. 1: A CHIMP—The basic magnetic element in FRAMM. Figure A presents the chiral vortex configuration of the magnetization. Gray scale code for the x component of the magnetisation. Figure B is a closer look to the core of the vortex (gray scale code for the x component of the of the magnetisation). Figure C is the same closer look as figure B, but with gray scale coding for the out of plane, z component of the magnetization. The core of the vortex appears dark. The vortex shown is (↑; −)

FIG. 1 illustrates a CHIMP, the basic magnetic element in FRAMM. FIG. 1A presents the chiral vortex configuration of the magnetization. Gray scale code for the x component of the magnetisation. FIG. 1B is a closer look at the core of the vortex (gray scale code for the x component of the magnetisation). FIG. 1C is the same closer look as FIG. 1B, but with gray scale coding for the out of plane, z component of the magnetization. The core of the vortex appears dark. The vortex shown is (↑; −).

Reading and Writing the FRAMM

Writing the Chirality

The chirality writing process is done CHIMP by CHIMP by sending an in-plane current pulse. Thanks to the spin transfer torque induced by in-plane current pulses, the vortex core is removed from the plaquette (see FIG. 2B and FIG. 2F). After the current pulse, if the CHIMP has the shape of a polygon with an odd number m of edges, then the demagnetising field will force magnetisation of the (m+1)/2 edges to turn in the opposite direction from the initial one. The magnetisation of the remaining (m−1)/2 edges will turn back to its initial orientation (see FIG. 2C and FIG. 2G). Because in this configuration the magnetic flux goes out of the CHIMP, it is not in its lower energy state. This is why magnetisation of the (m−1)/2 edges (minority) is reversed to close the magnetic flux (see FIG. 2D and FIG. 2H). Therefore, magnetisation of the m edges is reversed, i.e. the chirality is reversed.

As the process to write chirality destroys the vortex, polarity information is also lost. Indeed when the vortex is created again polarity states degenerate, so in order to predict in advance which one will stabilise is described in more detail below.

Figure 2:
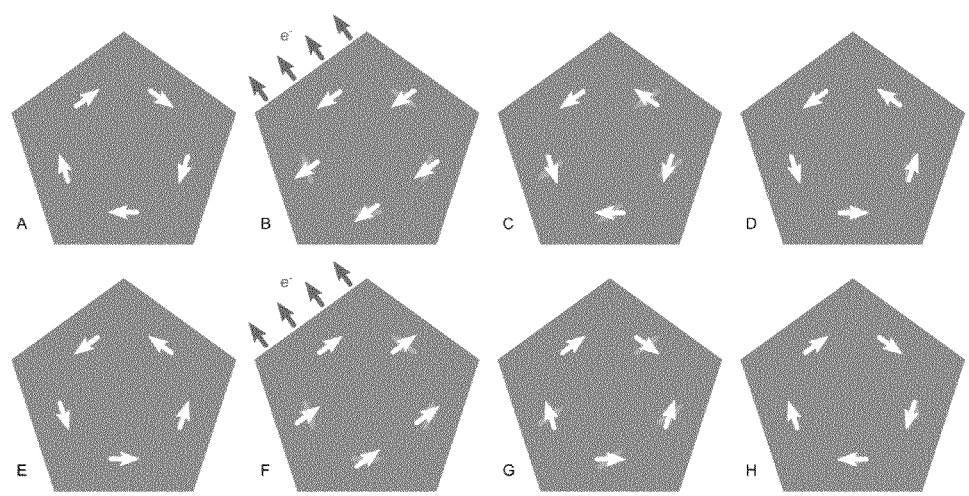
FIG. 2: Steps of the chirality writing process. First row (figures A to D) shows how to switch from + to − and the second row (figures E to H) shows how to switch from − to +. Figure A (resp. E) represents the + (resp. −) initial state.

FIG. 2 illustrates the steps of the chirality writing process. First row (figures A to D) shows how to switch from + to − and the second row (figures E to H) shows how to switch from − to +. FIG. 2A represents the + initial state. Figures B and G show the result of the current pulse applied along the green arrows. Figures C and G show the end of the first stage of the magnetisation stabilisation (due to demagnetising field). Figure D and H represent the final state with reversed chirality. In one embodiment the read and write frequency space can be easily obtained and there is also an odd number of sides on the FRAMM structure according to another embodiment.

Writing the Polarity

Like chirality, polarity can be written on each CHIMP independently with an in-plane electric current. An alternating current is used whose frequency is equal to the resonance frequency of the vortex. This will excite the natural dynamics of the vortex and, when the current intensity is high enough, it overcomes the damping. Then after few precessions of the gyrotropic mode, the core of the vortex switches its polarity without any effect on its chirality. The process is illustrated in FIG. 3 which illustrates simulation of polarity reversal with AC current, as shown by K. Yamada, S. Kasai, Y. Nakatani, K. Kobayashi, H. Kohno, A. Thiaville and T. Ono, "Electrical switching of the vortex core in a magnetic disk," *Nature Materials*, vol. 6, no. 4, pp. 270-273, 2007.

Reading the Relative Chirality

Just because a memory element has multiple states does not mean that it is possible to detect them. In a standard magnetic tunnel junction, the state of the storage (free) layer is measured with respect to a reference (pinned) layer. There are two states of the two-element stack →→ and →← which are distinguished by their resistance. The first arrow represents the pinned layer and the second represents the free layer.

For a stack of CHIMPs separated by tunnel barriers, the resistance depends on the relative chirality of each pair. ++ or −− means low resistance; −$_α$+$_β$ or +$_α$−$_β$ means high resistance. A three-CHIMP stack has three such states, and the n-CHIMP stack has n. They are distinguished by n−1 steps in the stack magnetoresistance. For example, if there is provided a magnetoresistance ΔR/R of 200% for a single junction, the possible resistance states for the three-CHIMP stack are 2R, 2R+ΔR, 2R+2ΔR, i.e. there are two steps of 100% resistance change separating the three states. In general, there are n−1 steps of ΔR/R(n−1) resistance change. Since single magnetic tunnel junctions with 300% magnetoresistance can now be fabricated, there is scope for developing stacks with n as high as 10.

Reading the Relative Polarity

The polarity configuration of the memory stack is read in frequency space. Each possible configuration has its own resonant frequency. If several CHIMPs are stacked, the cores will interact through the magnetic dipolar interaction. Then the system of cores will have its own resonant frequency depending on the relative polarities of the CHIMPs in the stack. This frequency may be sensed by high frequency current injection (in the range of radio frequency (RF) and microwave (MW), and the full sequence of polarity determined. Alternately the resonance of the stack may be excited with a current pulse of duration 0.1 ns-1 µs, and the RF response will contain the polarity information. We cannot distinguish one configuration from its image where all the spins are reversed, so we have half of $4^n$ distinct states. Each advance in technology, which allows the addition of another layer, yields a major improvement in the storage capacity with no change of footprint.

Figure 6:
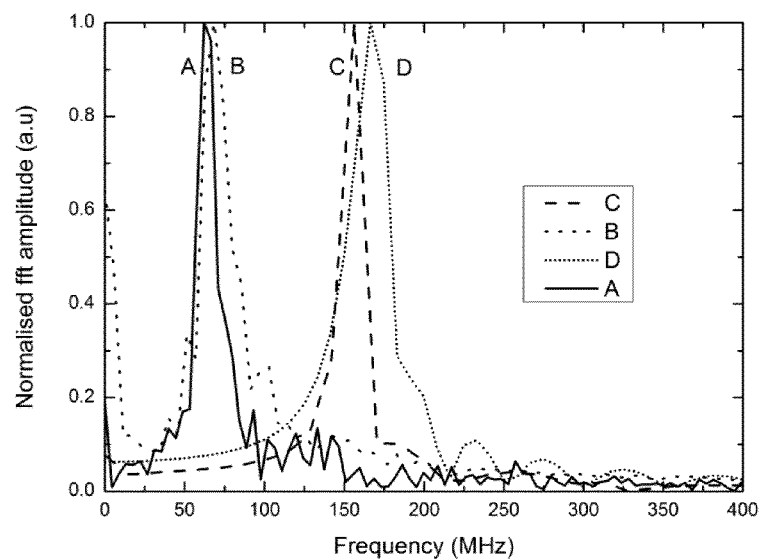

Alternative Way of Reading the Relative Polarity and Relative Chirality Together As shown in FIG. 6 and Table 1, when relative polarity is changed it produces a significant change in the resonant frequency of the stack. See line A and C or line B and D of Table 1.

TABLE 1

Extracted results from FIG. 6.

| Peak ID | Polarity | Chirality | Frequency | FWHM |
|---|---|---|---|---|
| A | Antiparallel | Parallel | 62.1 | 14.6 |
| B | Antiparallel | Antiparallel | 68.4 | 21.3 |
| C | Parallel | Parallel | 156.3 | 17.0 |
| D | Parallel | Antiparallel | 166.4 | 30.3 |

A change in relative chirality yields a smaller change in the resonant frequency (see line A and B or line C and D of Table 1.), that is generally smaller than the full width at half maximum (FWHM) of the peaks making them indistinguishable. If the width of the peaks can be reduced the full memory could be read in the frequency space. The two main ways to achieve this are, firstly to use magnetic material with very low Gilbert damping (α) such as a Heusler alloy, and secondly to increase the number of CHIMPs in the stack. It is interesting to note that this way it is possible to by-pass the limit of MR detection when the number of CHIMPs grows higher than ten. It also simplifies the detection system as there is no longer any need for a resistance measurement.

The number of states of the stack, counting both polarity and chirality is $4^n$, but only half of them (check) are normally distinguishable. Ways to enhance the number of distinguishable states are described below.

Implementation

Structure

Take the simplest example of the two CHIMP stack shown in FIG. 4. FIG. 4 (Left) illustrates the simplest CHIMP stack. CHIMPs, called α and β, are separated by an insulator. Contacts A, B, C and D are used to control the configuration of the stack. On the right is a three-CHIMP stack. As illustrated in this figure the lateral contacts C and D are difficult to fabricate.

Each chimp is contacted on two sides; so for a stack with n CHIMPs, 2n contacts are needed. To write CHIMP α, contacts A and B must be used and similarly for CHIMP β. To read the stack, either contacts A and or B and C should be used. Using contact A and C or B and D may generate RF power reflection due to the capacitive coupling; this could be critical for reading the relative polarities.

Operating Sequence

In the following, a sequence of operation of the CHIMP stack illustrated in left part of the FIG. 4 is represented in a table. First, the memory is read; then it is written twice. As explained in the paragraph "writing the chirality", the writing process annihilates the vortex and thus its polarity. Therefore, there are equal probabilities that the polarity of the new vortex is either correct or incorrect. Both cases are represented in the sequence; in the first writing example, the new polarity is correct. In the second it is incorrect and must be corrected with a further polarity inversion step.

TABLE 2

| Operation | Control | | | State | | | Read | |
| | $I_{AB}$ | $I_{CD}$ | $I_{AD}$ | α | β | bits | Resistance | Power |
|---|---|---|---|---|---|---|---|---|
| Initial state | | | | +↑ | −↑ | 10 = 2 | | |
| Read | | | Pulse | +↑ | −↑ | 10 = 2 | $R_{high}$ | $f_{low}$ |
| Write 00 | — | — | — | — | — | — | — | — |
| ↘write α chirality | Pulse | | | −↕ | −↑ | 0X = ? | | |
| ↘read polarity | | | Pulse | −↑ | −↑ | 00 = 0 | $R_{low}$ | $f_{low}$ |
| Write 01 | — | — | — | — | — | — | — | — |
| ↘write α polarity | RF | | | −↓ | −↑ | 01 = 0 | | |
| Write 11 | — | — | — | — | — | — | — | — |
| ↘write α chirality | Pulse | | | −↓ | +↕ | 1X = ? | | |
| ↘read polarity | | | Pulse | −↓ | +↓ | 10 = 2 | $R_{high}$ | $f_{low}$ |
| ↘write α polarity | RF | | | −↑ | +↓ | 11 = 3 | $R_{high}$ | $f_{high}$ |

Table 2 illustrates a sequence operation on a two-CHIMP stack without any way to distinguish more states than the non-degenerated ones. In this example of a two bit memory, the most significant bit (MSB) is represented by the resistance and the less significant bit (LSB) is represented by the frequency of resonance. The symbol "↕" signifies that the polarity in one of the CHIMPS, is undetermined, therefore the LSB is also undetermined and it is represented by an "X". Pulse and RF are used to distinguish the shapes of the pulses that are used in the control columns. R stands for resistance; f stands for frequency.

It will be appreciated that the invention provides several novel aspects over the prior art, for example:

Stacking chiral plaquettes

Coding information both in the polarity and the chirality of the elements in a stack Reading the magneto-resistance due to the vortices in the chiral stack Storing information in the resonant frequency of a stack of ferromagnetic chiral plaquettes Writing the chirality of a vortex with a current (rather than a magnetic field)

Alternatively, storing all the information in the resonant frequency of a stack.

The idea of stacking vortices in a TMR or GMR stack provides a novel and non-obvious solution over the state of the art.

FIG. 7 illustration of the "Pagoda" version of the FRAMM. This modification solves the contact issue of the middle CHIMP. (Left) 3D view. (Right) top view.

The invention provides a magnetic structure to read the relative polarity of several cores by the high frequency response of the stack has never been proposed. The invention works because CHIMPs are separated by (at most) a small fraction of their radius (typically a few nanometers), so the dipolar coupling between perpendicular cores will be high enough to have a significant influence on the dynamics of the system of vortices. The distinct frequency response for the different patterns of polarity of the stacks is likely to be in the range 1-1000 MHz.

During vortex precession, some of the chiral part generates stray field that produces additional coupling with other CHIMPs in the stack. This coupling lifts the degeneracy in frequency between parallel and antiparallel chirality for a given relative polarity. It is then possible to read the full stack state through its resonant frequency. As this latter coupling is much smaller than the one due to core polarity the frequency shift is much smaller. Consequently, in one embodiment of the invention one or both of the following actions are required:

Increase the frequency shift due to in plane dipolar coupling:
  by increasing the amplitude of the precession (This could be achieved by increasing the excitation current or by reducing the damping a of the CHIMP ferromagnetic material.)
  by increasing the stray field for a given precession amplitude (this could be achieved by increasing the magnetisation of the CHIMP material.).
Decrease the full width at half height of the peaks (this could be achieved by reducing as much as possible the damping of the CHIMP material and/or by stacking more vortices.).

Finally, an important aspect of the invention is that current is used instead of a magnetic field to write the chirality. Consequently, it is possible to control the vortices even when they are stacked.

There are simple ways to increase the number of distinguishable states, by breaking the symmetry of the stack. For example, each CHIMP could have a different anisotropy constant or magnetization, or the CHIMPs of the stack could have different thicknesses. This will lift the degeneracy of the states. This could be achieved by modifying the deposition conditions during manufacture, or by ion implantation.

As lateral planar contacts are difficult to produce, a "Pagoda" where the size of the upper CHIMPs is progressively reduced will allow the use of top contacts on each CHIMP. This shape should not have a drastic impact on the vortex dynamics as the core is usually confined near the centre of the CHIMP.

This modification will raise the chiral degeneracy of the stack as it breaks the symmetry along the z-axis.

The plaquettes could be made of a soft ferromagnet such as permalloy or a cubic Co—Fe alloy which provides high magnetoresistance when the plaquettes are separated by thin (1-5 nm) MgO tunnel barriers. Alternately CoFeB may be used with an annealing step known in the fabrication of MgO barrier magnetic tunnel junction. However, the use of ferromagnets with a higher spin polarization and lower damping such as certain Heusler alloys is advantageous as it will reduce the current density required to read and write information in the memory.

An alternative writing scheme is one-shot writing the polarity of the stack. In this case, the sequence of polarity of the CHIMPs in the stack determines a characteristic resonance frequency of the whole memory element. A suitably-shaped RF/microwave pulse at this frequency is used to write the polarity sequence of the whole stack. This will be most effective when the symmetry about a median plane is broken, in one of the ways mentioned above.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A multibit magnetic memory structure comprising a stack of two or more magnetic chiral plaquettes, where each plaquette has at least three distinct magnetic states wherein the magnetic state of the stack is read through a resonant frequency of the stack.

2. A multibit magnetic memory structure as in claim 1 wherein the plaquettes interact by dipole or exchange interactions so that different magnetic states of the stack are distinguished by distinct resonant frequencies.

3. A multibit magnetic memory structure as claimed in claim 2 wherein the distinct resonant frequencies are higher than 100 kHz.

4. A multibit magnetic memory structure as claimed in claim 1 wherein different magnetic configurations of the stack are distinguished by distinct values of the resistance and/or resonant frequency of the stack.

5. A multibit magnetic memory structure as claimed in claim 1 wherein magnetic chirality of individual plaquettes is adapted to be written by electric current pulses using a spin transfer torque.

6. A multibit magnetic memory structure as claimed in claim 1 wherein a magnetic vortex core polarity of individual plaquettes is adapted to be written by electric current pulses using a spin transfer torque.

7. A multibit magnetic memory structure as claimed in claim 6 wherein four different states can be controlled by said electrical pulses.

8. A multibit magnetic memory structure as claimed in claim 1 wherein the contents of the memory are read from the resistance and/or frequency response of the stack.

9. A multibit magnetic memory structure as claimed in claim 1 wherein the contents of the memory are written by a current pulse of resonant frequency of the stack.

10. A multibit magnetic memory structure as claimed in claim 1 where the composition, thickness or dimension of the individual plaquettes may be not uniform.

11. A magnetic memory comprises a plurality of chiral magnetic structures as claimed in claim 1.

12. A multibit magnetic memory structure as claimed in claim 5 wherein four different states can be controlled by said electrical pulses.

13. A multibit magnetic memory structure comprising a stack of two or more magnetic chiral plaquettes, where each plaquette has at least three distinct magnetic states, wherein the chiral plaquettes interact by dipole or exchange interactions so that different magnetic states of the stack are distinguished by distinct resonant frequencies.

14. A multibit magnetic memory structure comprising a stack of two or more magnetic chiral plaquettes, where each chiral plaquette has at least three distinct magnetic states, wherein the contents of the memory are writeable by a current pulse at a resonant frequency of the stack.

\* \* \* \* \*